(12) United States Patent
Mercaldi

(10) Patent No.: US 7,192,888 B1
(45) Date of Patent: Mar. 20, 2007

(54) LOW SELECTIVITY DEPOSITION METHODS

(75) Inventor: Garry A. Mercaldi, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 323 days.

(21) Appl. No.: 09/643,004

(22) Filed: Aug. 21, 2000

(51) Int. Cl.
*H01L 21/31* (2006.01)

(52) U.S. Cl. ............... 438/778; 438/680; 438/786; 438/787; 257/E21.101; 257/E21.278; 257/E21.293

(58) Field of Classification Search ............ 438/778, 438/791, 758, 763, 792, 786
See application file for complete search history.

(56) References Cited

U.S. PATENT DOCUMENTS

| | | | |
|---|---|---|---|
| 3,785,853 A | 1/1974 | Kirkman et al. | |
| 4,058,430 A | 11/1977 | Suntola et al. | 427/255.13 |
| 4,369,105 A | 1/1983 | Caldwell et al. | 204/290 F |
| 4,789,648 A * | 12/1988 | Chow et al. | 438/633 |
| 4,831,003 A | 5/1989 | Lang et al. | 502/182 |

(Continued)

FOREIGN PATENT DOCUMENTS

| | | |
|---|---|---|
| EP | 0794568 | 9/1997 |
| JP | 05-251339 | 9/1993 |

OTHER PUBLICATIONS

Aarik, et al, "Control of Thin Film Structure by Reactant Pressure in Atomic Layer Deposition of $TiO_2$.", Journal of Crystal Growth, 169 (1996) pp. 496–502.

Vernon, S.M., "Low–cost, high–efficiency solar cells utilizing GaAs–on–Si technology." Dialog Abstract of Report No. NREL/TP–451–5353; Apr. 1993.

Kiyoko et al., Patent Abstract Application No. 04–024917 (JP 9224917, Sep./1993),"Semiconductor Substrate and Its Manufacture."

Ritala, et al., "Atomic Layer Epitaxy—A Valuable Tool for Nanotechnology?" Nanotechnology, vol. 10, No. 1, pp. 19–24, Mar. 1999.

George, et al., "Surface Chemistry for atomic Layer Growth", Journal of Physical Chemistry, vol. 100, No. 31, pp. 13121–13121, Aug. 1, 1996.

Suntola, "Atomic Layer Epitaxy", Handbook of Crystal Growth, vol. 3, Chapter 14, pp. 602–663, 1994.

U.S. patent application Ser. No. 09/927,230, Doan, filed Aug. 2001.

(Continued)

*Primary Examiner*—George Fourson
*Assistant Examiner*—Julio J. Maldonado
(74) *Attorney, Agent, or Firm*—Wells St. John P.S.

(57) ABSTRACT

A deposition method includes forming a nucleation layer over a substrate, forming a layer of a first substance at least one monolayer thick chemisorbed on the nucleation layer, and forming a layer of a second substance at least one monolayer thick chemisorbed on the first substance. The chemisorption product of the first and second substance may include silicon and nitrogen. The nucleation layer may comprise silicon nitride. Further, a deposition method may include forming a first part of a nucleation layer on a first surface of a substrate and forming a second part of a nucleation layer on a second surface of the substrate. A deposition layer may be formed on the first and second parts of the nucleation layer substantially non-selectively on the first part of the nucleation layer compared to the second part. The first surface may be a surface of a borophosphosilicate glass layer. The second surface may be a surface of a rugged polysilicon layer. The first and second part of the nucleation layer may be formed simultaneously.

56 Claims, 3 Drawing Sheets

U.S. PATENT DOCUMENTS

| | | | |
|---|---|---|---|
| 4,913,090 A | | 4/1990 | Harada et al. |
| 5,116,640 A | | 5/1992 | Mikami et al. ............. 427/569 |
| 5,124,278 A | * | 6/1992 | Bohling et al. ............. 438/514 |
| 5,270,247 A | | 12/1993 | Sakuma et al. |
| 5,273,930 A | * | 12/1993 | Steele et al. ................ 438/312 |
| 5,281,274 A | | 1/1994 | Yoder .......................... 118/697 |
| 5,366,555 A | | 11/1994 | Kelly .......................... 117/719 |
| 5,366,953 A | * | 11/1994 | Char et al. .................. 505/329 |
| 5,413,671 A | | 5/1995 | Ketchum ..................... 216/37 |
| 5,462,603 A | | 10/1995 | Murakami |
| 5,480,818 A | | 1/1996 | Matsumoto et al. .......... 437/40 |
| 5,597,609 A | | 1/1997 | Beisswenger et al. ......... 427/8 |
| 5,597,756 A | * | 1/1997 | Fazan et al. ................. 438/398 |
| 5,616,208 A | | 4/1997 | Lee |
| 5,747,113 A | | 5/1998 | Tsai ........................ 427/255.5 |
| 5,879,459 A | | 3/1999 | Gadgil et al. ............... 118/715 |
| 5,916,365 A | | 6/1999 | Sherman |
| 5,929,526 A | * | 7/1999 | Srinivasan et al. ......... 257/768 |
| 5,937,300 A | | 8/1999 | Sekine et al. ............... 438/300 |
| 5,985,770 A | | 11/1999 | Sandhu et al. .............. 438/787 |
| 5,997,588 A | | 12/1999 | Goodwin et al. |
| 6,042,652 A | * | 3/2000 | Hyun et al. ................. 118/719 |
| 6,060,383 A | * | 5/2000 | Nogami et al. ............. 438/622 |
| 6,066,358 A | * | 5/2000 | Guo et al. .................... 427/99 |
| 6,083,832 A | | 7/2000 | Sugai .......................... 438/672 |
| 6,114,099 A | | 9/2000 | Liu et al. .................... 430/324 |
| 6,139,695 A | | 10/2000 | Washburn et al. |
| 6,143,659 A | | 11/2000 | Leem .......................... 438/688 |
| 6,165,916 A | | 12/2000 | Muraoka et al. ............ 438/791 |
| 6,174,377 B1 | | 1/2001 | Doering et al. |
| 6,203,613 B1 | | 3/2001 | Gates et al. ................ 117/104 |
| 6,203,618 B1 | | 3/2001 | McMillan |
| 6,235,571 B1 | * | 5/2001 | Doan .......................... 438/240 |
| 6,258,690 B1 | * | 7/2001 | Zenke ......................... 438/396 |
| 6,270,572 B1 | | 8/2001 | Kim et al. .................... 117/93 |
| 6,287,965 B1 | | 9/2001 | Kang et al. ................. 438/648 |
| 6,290,824 B1 | | 9/2001 | Ishikawa et al. ....... 204/298.16 |
| 6,306,216 B1 | | 10/2001 | Kim et al. ................... 118/725 |
| 6,307,184 B1 | | 10/2001 | Womack et al. |
| 6,330,201 B2 | | 12/2001 | Shibata ....................... 365/203 |
| 6,335,561 B2 | | 1/2002 | Imoto ......................... 257/626 |
| 6,338,874 B1 | * | 1/2002 | Law et al. ............. 427/255.18 |
| 6,355,561 B1 | | 3/2002 | Sandhu |
| 6,358,377 B1 | | 3/2002 | Schloremberg et al. ..................... 204/192.12 |
| 6,368,954 B1 | * | 4/2002 | Lopatin et al. ............. 438/627 |
| 6,399,921 B1 | | 6/2002 | Johnsgard et al. |
| 6,447,908 B2 | | 9/2002 | Yun et al. ................... 428/403 |
| 6,458,416 B1 | * | 10/2002 | Derderian et al. .......... 427/301 |
| 6,479,902 B1 | * | 11/2002 | Lopatin et al. ............. 257/774 |
| 6,500,763 B2 | * | 12/2002 | Kim et al. ................... 438/689 |
| 6,596,636 B2 | | 7/2003 | Sandhu ....................... 438/676 |
| 6,620,723 B1 | | 9/2003 | Byun et al. ................. 438/627 |
| 6,627,260 B2 | | 9/2003 | Derderian et al. .......... 427/301 |
| 6,627,503 B2 | | 9/2003 | Ma et al. .................... 438/287 |
| 6,630,201 B2 | | 10/2003 | Chiang et al. ......... 427/255.28 |
| 6,727,169 B1 | | 4/2004 | Raaijmakers et al. ....... 438/622 |
| 2002/0066411 A1 | | 6/2002 | Chiang et al. .............. 118/724 |
| 2002/0125516 A1 | | 9/2002 | Marsh et al. |
| 2004/0097022 A1 | * | 5/2004 | Werkhoven et al. ........ 438/149 |
| 2005/0101119 A1 | | 5/2005 | Li et al. ..................... 438/624 |
| 2005/0124153 A1 | | 6/2005 | Cohen ......................... 438/634 |
| 2005/0124158 A1 | | 6/2005 | Lopatin et al. ............. 438/686 |
| 2005/0124171 A1 | | 6/2005 | Vaartstra ..................... 438/778 |

OTHER PUBLICATIONS

U.S. patent application Ser. No. 09/652,533, Sandhu, filed Aug. 2000.

U.S. patent application Ser. No. 09/652,533, Sandhu et al., filed Aug. 31, 2000.

Suntola, "Surface Chemistry of Materials Deposition at Atomic Layer Level", Applied Surface Science, vol. 100/101, Mar. 1996, pp. 391–398.

Aarik et al, "Effect of Growth Conditions on Formation of TiO2–II Thin Films in Atomic Layer Deposition Process", Journal of Crystal Growth, vol. 181, Aug. 1997, pp. 259–264.

Skarp, "ALE–Reactor for Large Area Depositions", Applied Surface Science, vol. 112, Mar. 1997, pp. 251–254.

U.S. Appl. No. 09/653,553, Sandhu (as amended Jan. 6, 2003 & Jun. 23, 2003) filed Aug. 31, 2000.

U.S. Appl. No. 09/652,533, Sandhu (as amended Feb. 22, 2002), filed Aug. 2000.

U.S. Appl. No. 09/927,230, Doan, filed Aug. 2001.

U.S. Appl. No. 09/652,533, Sandhu, filed Aug. 2000.

Suntola, "Surface Chemistry of Materials Deposition at Atomic Layer Level", Applied Surface Science, vol. 100/101, Mar. 1996, pp. 391–398.

Aarik et al, "Effect of Growth Conditions on Formation of TiO2–II Thin Films in Atomic Layer Deposition Process", Journal of Crystal Growth, vol. 181, Aug. 1977, pp. 259–264.

Skarp, "ALE–Reactor for Large Area Depositions", Applied Surface Science, vol. 112, Mar. 1997, pp. 251–254.

* cited by examiner

LOW SELECTIVITY DEPOSITION METHODS

TECHNICAL FIELD

This invention relates to methods of atomic layer deposition and methods of low selectivity chemical vapor deposition.

BACKGROUND OF THE INVENTION

Atomic layer deposition (ALD) is recognized as a deposition technique that forms high quality materials with minimal defects and tight statistical process control. Even so, it is equally recognized that ALD can have limited application. In some circumstances, the theoretically expected quality of an ALD layer is not achieved.

It can be seen that a need exists for an ALD method that forms a layer without, introducing intolerable defects into the material.

BRIEF DESCRIPTION OF THE DRAWINGS

Preferred embodiments of the invention are described below with reference to the following accompanying drawings.

SUMMARY OF THE INVENTION

Figure 1:
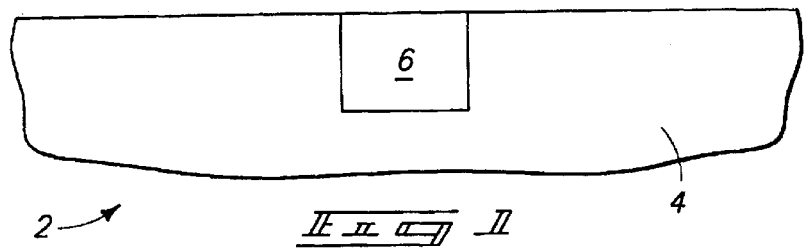
FIG. 1 shows a cross-sectional fragmentary view of a deposition substrate at one processing step in accordance with an aspect of the invention.

One aspect of the invention provides a deposition method that includes forming a nucleation layer over a substrate, forming a layer of a first substance at least one monolayer thick chemisorbed on the nucleation layer, and forming a layer of a second substance at least one monolayer thick chemisorbed. on the first substance. A chemisorption product of the first and second substance may include silicon and nitrogen, or aluminum and oxygen, or tantalum and oxygen. Also, the nucleation layer may comprise silicon nitride, aluminum oxide, or tantalum oxide. A thickness of the. nucleation layer may be less than about 20 Angstroms.

In another aspect of the invention, a low selectivity deposition method includes forming a first part of a nucleation layer on a first surface of a substrate and forming a second part of a nucleation layer. on a second surface of a substrate. A deposition layer may then be formed on the first and second parts of the nucleation layer substantially non-selectively on the first part of the nucleation layer compared to the second part. Substantially non-selective deposition occurs even though the first and second surfaces of the substrate exhibit a property of the deposition layer forming less readily on the first surface compared to the second surface. The deposition layer may comprise a monolayer of a first chemisorbed specie. The deposition layer may be formed by chemical vapor deposition or atomic layer deposition. The first and second part of the nucleation layer may be formed simultaneously. Also, the nucleation layer may form substantially non-selectively on the first surface of the substrate compared to the second surface. Further, a thickness of the first part of the nucleation layer may be. greater than 50% of a thickness of the second part, or even greater than 80% of the thickness of the second part. The first surface of the substrate may exhibit a property of chemisorbing the first specie at a slower rate compared, to the second surface.

In another aspect, a deposition method includes simultaneously forming a first part of a nucleation layer on an insulative oxide material and a second part of the nucleation layer on a semiconductive material. The nucleation layer may be contacted with an initiation precursor. An initiation layer at last one monolayer thick may be formed on the first and second parts of the nucleation layer substantially non-selectively on the first part of the nucleation layer compared to the second part.

In another deposition method, a nucleation layer comprising silicon and nitrogen may be formed substantially non-selectively on a first and a second surface of a substrate. A monolayer of a first substance may be chemisorbed on the nucleation layer. A monolayer of a second substance may be chemisorbed on the first substance, wherein a chemisorption product of the first and second substances comprises silicon nitride.

In a still further aspect, a deposition method may include atomic layer depositing a nucleation substance chemisorbed on a first surface and a second surface of a substrate substantially non-selectively. The first surface may exhibit a property of chemisorbing an atomic layer deposition precursor at a slower rate compared to the second surface. Also, the nucleation substance may exhibit a property of chemisorbing the precursor at an approximately equal rate over the first surface compared to over the second surface.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Atomic layer deposition (ALD) involves formation of successive atomic layers on a substrate. Such layers may comprise an epitaxial, polycrystalline, amorphous, etc. material. ALD may also be referred to as atomic layer epitaxy, atomic layer processing, etc. Further, the invention may encompass other deposition methods not traditionally referred to as ALD, for example, chemical vapor deposition (CVD), but nevertheless including the method steps described herein. The deposition methods herein may be described in the context of formation on a semiconductor wafer. However, the invention encompasses deposition on a variety of substrates besides semiconductor substrates.

In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Described in summary, ALD includes exposing an initial substrate to a first chemical specie to accomplish chemisorption of the specie onto the substrate. Theoretically, the chemisorption forms a monolayer that is uniformly one atom or molecule thick on the entire exposed initial substrate. Practically, as further described below, chemisorption might not occur on all portions of the substrate. Nevertheless, such an imperfect monolayer is still a monolayer in the context of this document. The first specie is purged from over the substrate and a second chemical specie is provided to chemisorb onto the first monolayer of the first specie. The second specie is then purged and the steps are repeated with exposure of the second specie monolayer to the first specie. In some cases, the two monolayers may be of the same specie. Also, additional species may be successively chemisorbed and purged just as described for the first and second species.

ALD is often described as a self-limiting process, in that a finite number of sites exist on a substrate to which the first specie may form chemical bonds. The second specie might only bond to the first specie ad thus may also be self-limiting. Once all of the finite number of sites on a substrate are bonded with a first specie, the first specie will often not bond to other of the first specie already bonded with the substrate. However, process conditions can be varied in ALD as discussed below to promote such bonding and render ALD not self-limiting. Accordingly, ALD may also encompass a specie forming other than one monolayer at a time by stacking of a specie, forming a layer more than one atom or molecule thick. The various aspects of the present invention described herein are applicable to any circumstance where ALD may be desired. A few examples of materials that may be deposited by ALD include silicon nitride, zirconium oxide, tantalum oxide, aluminum oxide, and others. Examples of specie pairs for ALD of silicon nitride include $NH_3/SiHCl_3$ and others.

ALD offers a variety of advantages and improvements over other methods of forming materials on a substrate. However, ALD layers formed on a substrate may also possess thickness variations caused by variations in the composition and/or surface properties of the underlying substrate. Such disadvantage can limit the application of ALD methods to exclude applications where ALD might otherwise be particularly advantageous.

For example, when a material is to be deposited simultaneously over multiple types of substrates or over a single type of substrate having different surface properties, ALD may be a poor candidate for forming the material. Experience indicates that material formed by ALD may not form at a uniform rate on differing types of substrates or on a single type of substrate having multiple surface properties in multiple areas. The different rates of formation produce defects and/or varying thicknesses in the deposited material. Accordingly, even though ALD may be used to form very thin layers of material, thickness variations may produce unacceptable defects.

For example, a layer of polysilicon may include isolated areas where a surface defect reduces the likelihood of formation of a material on the surface defect by ALD. The differences in deposition rate may create thickness variations in the deposited material. Also, for example, a desire may exist to simultaneously deposit a material over two dissimilar types of substrate. A surface of borophosphosilicate glass (BPSG) and a surface of polysilicon can be two dissimilar types of substrate. Observations indicate that formation of silicon nitride by ALD simultaneously on BPSG and polysilicon produces a thickness variation in the deposited silicon nitride. The thickness of the silicon nitride deposited on the BPSG can be less than 50% of the thickness of the silicon nitride deposited on the polysilicon. A variety of other circumstances are conceivable wherein a substantially uniform thickness of a material deposited by ALD is desired on dissimilar portions of a substrate, such as a semiconductive substrate compared to an insulative or a conductive substrate.

Figure 2:
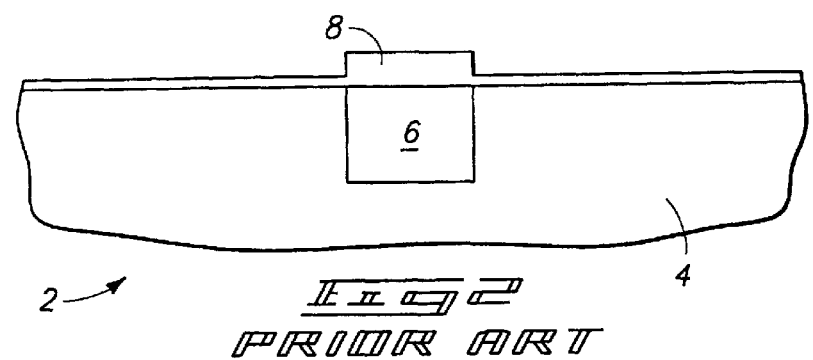
FIG. 2 shows the deposition substrate of FIG. 1 at a processing step subsequent to that shown in FIG. 1.

According to one aspect of the invention, a deposition method may include forming a nucleation layer over a substrate. The nucleation layer may exhibit a first value of an electrical property, for example, dielectric constant, conductivity, current leakage, permitivity, capacitance, etc. Turning to FIG. 1, a substrate 2 is shown including a first part 4 and a second part 6. Second part 6 may comprise a composition different from first part 4 or second part 6 may comprise the same composition but exhibit a property that causes deposition to occur more readily on second part 6 compared to first part 4. FIG. 2 shows a deposition layer 8 formed on first part 4 and second part 6 of substrate 2. Notably, the thickness of deposition layer 8 that is over first part 4 is less than 50% of a thickness of deposition layer 8 that is over second part 6.

There can be at least one advantage of providing a nucleation layer over a substrate prior to performing some types of deposition, for example ALD. The nucleation layer may operate to provide at least somewhat uniform surface properties for the deposition and decrease thickness variations such as shown in FIG. 2. Even so, a nucleation layer may interface between a substrate. and a subsequently deposited deposition layer in a manner that only insignificantly influences the overall properties of the combined nucleation and deposition layer. That is, a deposition layer deposited directly on a substrate without a nucleation layer generally will possess some designated purpose or designated property. A nucleation layer may be selected such that only an insignificant impact is imposed upon the desired purpose or property. Accordingly, a nucleation layer may find advantageous use even in circumstances where a substrate possesses both a homogeneous composition and homogeneous surface properties. Such a nucleation layer may interface between a substrate and a deposition layer to enhance the rate of formation of the deposition layer or to otherwise provide an advantageous property or result. For example, a first monolayer of a first chemisorbed specie may form more rapidly over BPSG if a nucleation layer is first formed.

In addition to composition and surface properties, the thickness of a nucleation layer may also influence its suitability. At times, ALD is selected with the desire to form high quality very thin layers of material. A nucleation layer may be selected that only insignificantly impacts the deposition layer. However, as the thickness of a nucleation layer increases and approaches or exceeds the thickness of a deposition layer, the potential advantages of selecting ALD for forming a layer of the material may be diminished. At the optimum, a nucleation layer having a thickness of only one atom or molecule may be formed to minimize any potential impact. However, a more thick nucleation layer may also ii provide little impact. Accordingly, a thickness of a nucleation layer may comprise less than about 20 Angstroms. Further, the thickness may comprise less than about 6 Angstroms. Still further, the thickness may comprise about 2.5 Angstroms. A monolayer of silicon nitride may comprise about 2.5 Angstroms.

Figure 3:
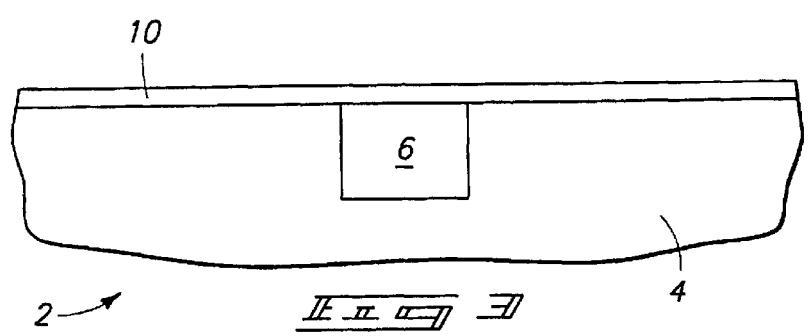
FIG. 3 shows the deposition substrate of FIG. 1 at an alternative processing step subsequent to that shown in FIG. 1.

In FIG. 3, a nucleation layer 10 is shown formed over substrate 2. In the illustration provided, substrate 2 includes first part 4 on which deposition occurs less readily compared to second part 6. As indicated, such a property may be caused by first part 4 possessing a different composition than second part 6 or exhibiting a different surface property than second part 6. Such is in contrast to another advantageous use of nucleation layer 10 even when a substrate possesses homogeneous composition and exhibits homogeneous surface properties.

Figure 4:
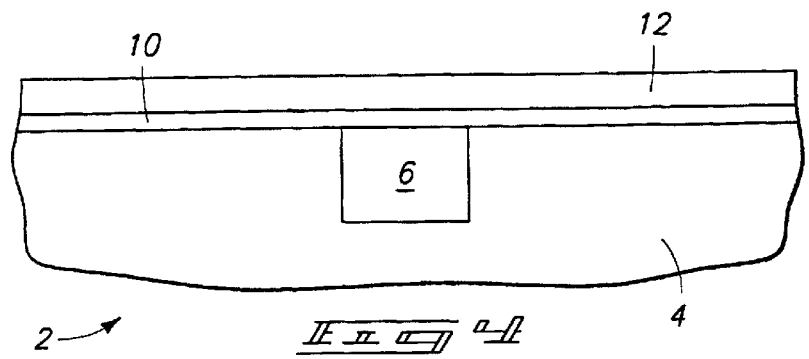
FIG. 4 shows the deposition substrate of FIG. 1 at a processing step subsequent to that shown in FIG. 3.

As shown in FIG. 4, a deposition layer 12 may be formed on nucleation layer 10 without the thickness variation illustrated in FIG. 2. Deposition layer 12 may be formed by any deposition method presently known to those skilled in the art or later developed, but preferably by ALD as defined herein. Other deposition methods may also be suitable. In the present aspect of the invention, a suitable deposition method may include forming a layer of a first substance at least one monolayer thick chemisorbed on the nucleation layer and forming a layer of a second substance at least one monolayer thick chemisorbed on the first substance. A chemisorption product of the layers may comprise deposition layer 12. Deposition layer 12 may exhibit a second value of the electrical property exhibited by nucleation layer 10 at a first value. Examples of electrical properties are listed above. Deposition layer 12 and nucleation layer 10 combined may exhibit a third value of the electrical property that is more near the second value than the first value. The third value and second value may be approximately equal. The method may include at least once additionally forming successive monolayers of the first substance and the second substance. In such case, all monolayers may be comprised by deposition layer 12.

Nucleation layer 10 may possess a variety of compositions and exhibit a variety of properties and still comprise a suitable interface between deposition layer 12 and a substrate, for example substrate 2. For example, nucleation layer 10 may comprise a compound the same as a deposition product of the first and second substances in the chemisorbed monolayers described above. For example, a chemisorption product of the first and second substance may comprise silicon and nitrogen. A nucleation layer may also comprise silicon and nitrogen. More specifically, the chemisorption product that produces deposition layer 12 may comprise silicon nitride and nucleation 10 may also comprise silicon nitride.

A nucleation layer may comprise an approximately homogeneous composition. In an approximately homogeneous composition, only insignificant differences in composition exist throughout the nucleation layer. However, a nucleation layer may also possess a composition wherein one part of the nucleation layer differs from a composition of another part of the nucleation layer as to a component, a proportion of a component, or both. One example is a nucleation layer that comprises silicon nitride but a part of the nucleation layer further comprises oxygen, for example, comprising silicon oxynitride.

In another aspect of the invention, a deposition method includes forming a first part of a nucleation layer on a first surface of a substrate and forming a second part of a nucleation layer on a second surface of the substrate. Forming the first and second part of the nucleation layer may occur simultaneously. Alternatively, the first part and the second part of the nucleation layer may be formed separately. When formed simultaneously, the nucleation layer may form substantially non-selectively on the first surface of the substrate compared to the second surface. The thickness of a nucleation layer is one measure of the selectivity of forming a nucleation layer. That is, non-selective formation of a nucleation layer may occur when the thickness of the first part of the nucleation layer on the first surface of a substrate is greater than 50% of the thickness of the second part formed on the second surface of the substrate. More particularly, non-selective formation occurs when the thickness of the first part is greater than 80% of the thickness of the second part.

One advantage of the present invention is that substantially nonselective formation of a nucleation layer may occur even though ALD on the same surface occurs selectively, that is, at a greater than 2 to 1 ratio of deposition rate. Such a deposition may produce a deposition layer having a thickness over the first surface that is less than 50% of the thickness over the second surface.

A variety of nucleation layer compositions are conceivable just as a variety of nucleation layer thicknesses and selectivities are conceivable. The second part of the nucleation layer on the second surface of the substrate may comprise a plurality of components also comprised by the first part. For example, the first and second parts of the nucleation layer may comprise silicon nitride. Further, the first and second parts of the nucleation layer may even consist essentially of the same components in approximately same proportions. For example, the first and second parts of the nucleation layer may comprise an approximately homogeneous composition. However, the composition of the first part of the nucleation layer may also differ from the composition of the second part of the nucleation layer. In such a circumstance, the first and second parts of the nucleation layer may still both comprise silicon nitride. In addition, the first part may further comprise oxygen, for example, as in silicon oxynitride.

The present aspect of the invention may further include forming a monolayer of a first chemisorbed specie on the first and second parts of the nucleation layer substantially non-selectively on the first part of the nucleation layer compared to the second part. Such non-selective formation of a monolayer of a first chemisorbed specie may occur even though the first surface of the substrate exhibits a property of chemisorbing the first specie at a slower rate compared to the second surface. This circumstance indicates one advantage of the present aspect of the invention. Namely, the nucleation layer may operate to interface between a deposition layer and a substrate to alter properties such that deposition occurs substantially non-selectively. The deposition method may further comprise forming a monolayer of a second chemisorbed specie different from the first specie on the first specie layer. It may be advantageous that the nucleation layer comprise a material also comprised by the first and second specie layers combined. For example, the first and second specie layers, in combination, may comprise silicon and nitrogen. The nucleation layer may similarly comprise silicon and nitrogen.

In another aspect of the invention, a deposition method includes simultaneously forming a first part of a nucleation layer on an insulative oxide material and a second part of the nucleation layer on a semiconductive material. The nucleation layer may then be contacted with an initiation precursor. The method further includes forming an initiation layer at least one monolayer thick on the first and second parts of the nucleation layer substantially non-selectively on the first part of the nucleation layer compared to the second part. The method further may comprise contacting the initiation layer with a deposition precursor and forming a deposition layer at least one monolayer thick on the initiation layer.

A variety of specific methods exist for forming the first part and the second part of the nucleation layer described in the various aspects of the invention above to achieve subsequent formation of a substantially non-selective monolayer or other deposition layer. The method selected may be in situ with regard to subsequent formation of the deposition layer or it may be ex situ. ALD may itself comprise one example of an in situ method. For example, a substrate may be placed in a first chamber and the first and second parts of a nucleation layer formed thereon by ALD. Without removing the substrate from the chamber, a monolayer of a first chemisorbed precursor may then be formed on the nucleation layer also by ALD.

Often, traditional ALD occurs within an often-used range of temperature and pressure and according to established purging criteria to achieve the desired formation of an overall ALD layer one monolayer at a time. Even so, ALD conditions can vary greatly depending on the particular precursors, layer composition, deposition equipment, and other factors according to criteria known by those skilled in the art. Maintaining the traditional conditions of temperature, pressure, and purging minimizes unwanted reactions that may impact monolayer formation and quality of the resulting overall ALD layer. Accordingly, operating outside the traditional temperature and pressure ranges may risk formation of defective monolayers.

In accordance with the present aspect of the invention, observations indicate that increasing temperature or pressure or both can produce the effect of reducing the selectivity of an otherwise selective monolayer formation step. In the various aspects of the invention, temperature may remain below about 550 Celsius (° C.) and pressure may remain below about 20 Torr. The increased temperature, pressure, or both correspondingly increases the likelihood that a deposition specie will chemisorb substantially non-selectively on the first and second surfaces of the substrate as described above and shown in FIG. 3. Even though such a process regime risks defective monolayer formation, such process may be used to form a nucleation layer by ALD. The deposition layer may be formed in a traditional ALD process regime at lower temperature and pressure. For example, traditional ALD of silicon nitride may occur at a temperature of from about 400° C. to about 550° C. and a pressure of less than about 100 milliTorr. Different ranges are also conceivable, as determinable by those skilled in the art, depending on deposition precursors, nucleation layer composition, surface properties, and other factors. Depending on the desired properties of the deposition layer, such layer may also be formed by ALD outside the traditional ALD process regime.

Another example of an in situ method involves chemical vapor deposition (CVD). The general technology of CVD includes a variety of more specific processes, including, but not limited to, plasma enhanced CVD and others. CVD is commonly used to form non-selectively a complete, deposited material on a substrate. One characteristic of CVD is the simultaneous presence of multiple species in the deposition chamber that react to form the deposited material. Such condition is contrasted with the purging criteria for traditional ALD wherein a substrate is contacted with a single deposition specie and chemisorbs to a substrate or previously deposited specie. A nontraditional ALD process regime may provide simultaneously contacted species of a type or under conditions such that ALD chemisorption, rather than CVD reaction occurs.

As one example, U.S. patent application Ser. No. 09/619,449 filed Jul. 19, 2000 by Garo J. Derderian and Gurtej S. Sandhu entitled "Deposition Methods" and assigned to Micron Technologies, Inc. discloses a nontraditional ALD process and is herein incorporated by reference. Derderian et al. describe a deposition method including contacting a substrate with a first initiation precursor and forming a first portion of an initiation layer on the substrate. At least a part of the substrate is contacted with a second initiation precursor different from the first initiation precursor and a second portion of the initiation layer is formed on the substrate. The invention may include simultaneously contacting a substrate with a plurality of initiation precursors, forming on the substrate an initiation layer comprising components derived from each of the plurality of initiation precursors. However, the plurality of initiation precursors do not react together as in CVD. Rather, they chemisorb to the substrate, providing a surface onto which a deposition specie may next chemisorb to form a complete layer of desired material.

Under most CVD conditions, deposition of the material occurs largely independent of the composition or surface properties of an underlying substrate. However, deposition rate can be a frequent issue in performing CVD. High deposition rates are often desired to increase production output as long as such rates do not significantly diminish the quality of a deposited material. Accordingly, depending on the particular type of CVD technique, a process regime is selected that produces as high a deposition rate as is possible without significant negative impacts on material quality.

In the present aspect of the invention, deposition rate is a less significant issue. Accordingly, observation indicates that lower pressures, temperatures, plasma intensities, reactant concentrations, etc., than would otherwise be traditionally accepted may be used to produce a nucleation layer. CVD of a nucleation layer may thus occur at a deposition rate that conventionally might not qualify for a suitable CVD process. For example, traditional CVD of silicon nitride may occur at a temperature between about 600° C. to about 800° C. and a pressure between about 100 milliTorr to about 2 Torr, depending on the selected temperature. If temperature is toward the low end of the range, then pressure is generally toward the high end of the range to stay within the traditional process regime. Exemplary parameters for nontraditional CVD of a nucleation layer may fall below one or both of such ranges or be in the low end of both ranges. Different ranges are conceivable, as determinable by those skilled in the art, depending on deposition precursors, substrate composition, surface properties, and other factors.

Since CVD is typically a non-selective form of deposition, the non-traditional process regime can produce a suitable nucleation layer having a thickness of one atom or molecule or more. Specifically, formation of an approximately 4 to 6 Angstrom silicon nitride nucleation layer from ammonia and dichlorosilane (DCS) has been achieved at a pressure of less than approximately 1.5 Torr, a temperature of approximately 645° C., and a processing time of about 2 minutes. Depending on the CVD technique selected, the same reaction chamber or tool may be used. both for CVD of a nucleation layer and ALD of a deposition layer. Thus, the hybrid structure of the CVD nucleation layer and ALD deposition layer may be formed possessing the advantageous qualities of an ALD material and such formation may be accomplished in situ.

Further, forming a deposition layer may occur by unconventional CVD in a process regime so far outside conventional CVD that the deposition is substantially selective. That is, multiple deposition species may contact the substrate together in the deposition chamber. However, temperature and pressure are low enough that the thickness of the deposition layer over a first part of a substrate is less than 50% of a thickness of the deposition layer over a second part, as shown in FIG. 2. Exemplary parameters include less than about 645° C. and less than about 500 milliTorr or perhaps different ranges, as determinable by those skilled in the art, depending on above mentioned factors. In such a process regime, pressure might bear a more significant effect on selectivity compared to temperature. The unconventional CVD process regime may be conducive to forming a deposition layer only about 1 to 5 atoms or molecules thick. Accordingly, by using a nucleation layer in keeping with the various aspects of the present invention, unconventional CVD may also be used to form a deposition layer.

As examples of ex situ processing, any of the above-described ALD or CVD techniques may be used. A substrate may be placed in a first chamber and the first and second parts of a nucleation layer formed on the substrate. The substrate may then be removed from the first chamber and placed in a second chamber different from the first. Formation of an ALD precursor monolayer or unconventional CVD layer may then occur in the second chamber. Accordingly, the first chamber may comprise any tool suitable for accomplishing CVD or ALD.

The first chamber may further comprise any tool suitable for accomplishing techniques such as rapid thermal nitridation (RTN), remote plasma nitridation (RPN), techniques for accomplishing growth of a material (as opposed to deposition) on a substrate, and other techniques. RTN, RPN, and other techniques can involve growth of a nucleation layer non-selectively on first and second surfaces of a substrate. RTN often occurs in an ammonia ambient at a temperature of greater than 700° C. Temperature may be limited to about 800° C. in circumstances where thermal budget limitations exist. RPN is performed similarly except that a plasma is used to provide reactive nitrogen radicals in a manner that provides reduction of process temperature. Accordingly, RPN may be preferred in a circumstance with a sensitive thermal budget.

Material growth techniques, for example RTN, RPN, and others, may produce a nucleation layer the composition and selectivity of which can be influenced by the composition of the underlying substrate. For example, one potential substrate is one wherein first part 4 of substrate 2 in FIG. 1 comprises BPSG and second part 6 comprises polysilicon. BPSG comprises silicon, oxygen, boron, and phosphorous. Polysilicon comprises primarily silicon. Both materials comprise silicon, accordingly, thermal growth techniques may produce a silicon-containing material grown on the substrate. Nitride growth techniques may produce silicon nitride on both materials. However, the silicon nitride material grown on BPSG may also include oxygen, for example, the material may comprise silicon oxynitride. Usually, the boron and phosphorous dopants of BPSG will not be incorporated into the grown material.

In some circumstances, one part of a substrate comprises silicon and another part of the substrate does not comprise silicon. Whether a nitride or other grown material will form on the substrate will depend on the susceptibility of the non-silicon-comprising material to such growth technique. Accordingly, a grown nucleation layer may form substantially non-selectively on a substrate or it may form selectively on a substrate depending on the criteria discussed above. Nevertheless, it is conceivable within the various aspects of the invention that an ex situ processing method may form a first and a second part of a nucleation layer simultaneously and substantially non-selectively on a first and second surface of a substrate. Such may occur even though the first surface of the substrate exhibits a property of chemisorbing a first precursor at a slower rate compared to the second surface. Deposition of a material may subsequently occur on the ex situ formed nucleation layer also substantially non-selectively.

Figure 5:
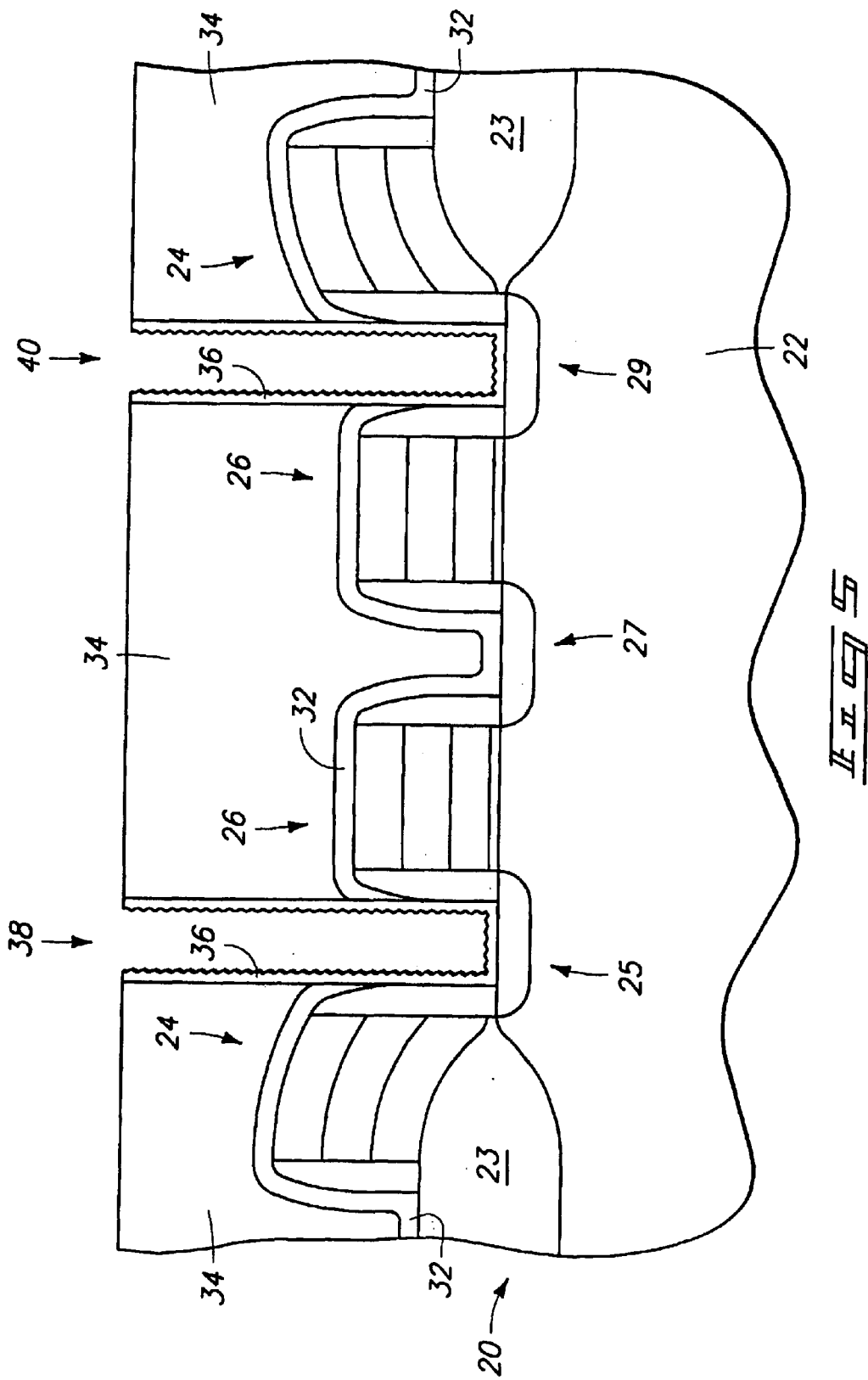
FIG. 5 shows a cross-sectional fragmentary view of a semiconductive wafer portion at a processing step in accordance with an aspect of the invention.

Another aspect of the invention holds specific application to forming container capacitor structures. FIG. 5 shows a semiconductive wafer construction 20 having partially formed dynamic random access memory (DRAM) cells formed thereon. Semiconductive wafer construction 20 includes a semiconductive material 22, for example, a bulk silicon wafer, and a field oxide 23 formed on semiconductive material 22. Node locations 25, 27, and 29 are formed within semiconductive material 22. Word lines 24 are formed over field oxide 23 and word lines 26 are formed over semiconductive material 22. An oxide layer 32 formed over word lines 24 and 26 prevents diffusion of dopants within a BPSG layer 34 into word lines 24 and 26. Capacitor openings 38 and 40 are formed through BPSG layer 34 to expose node locations 25 and 29, respectively. A storage node layer 36 is formed on BPSG layer 34 and in electrical connection with node locations 25 and 29. Storage node layer 36 may comprise polysilicon, or more preferably rugged polysilicon. Rugged polysilicon may include hemispherical grain polysilicon, spherical grain polysilicon, etc.

Figure 6:
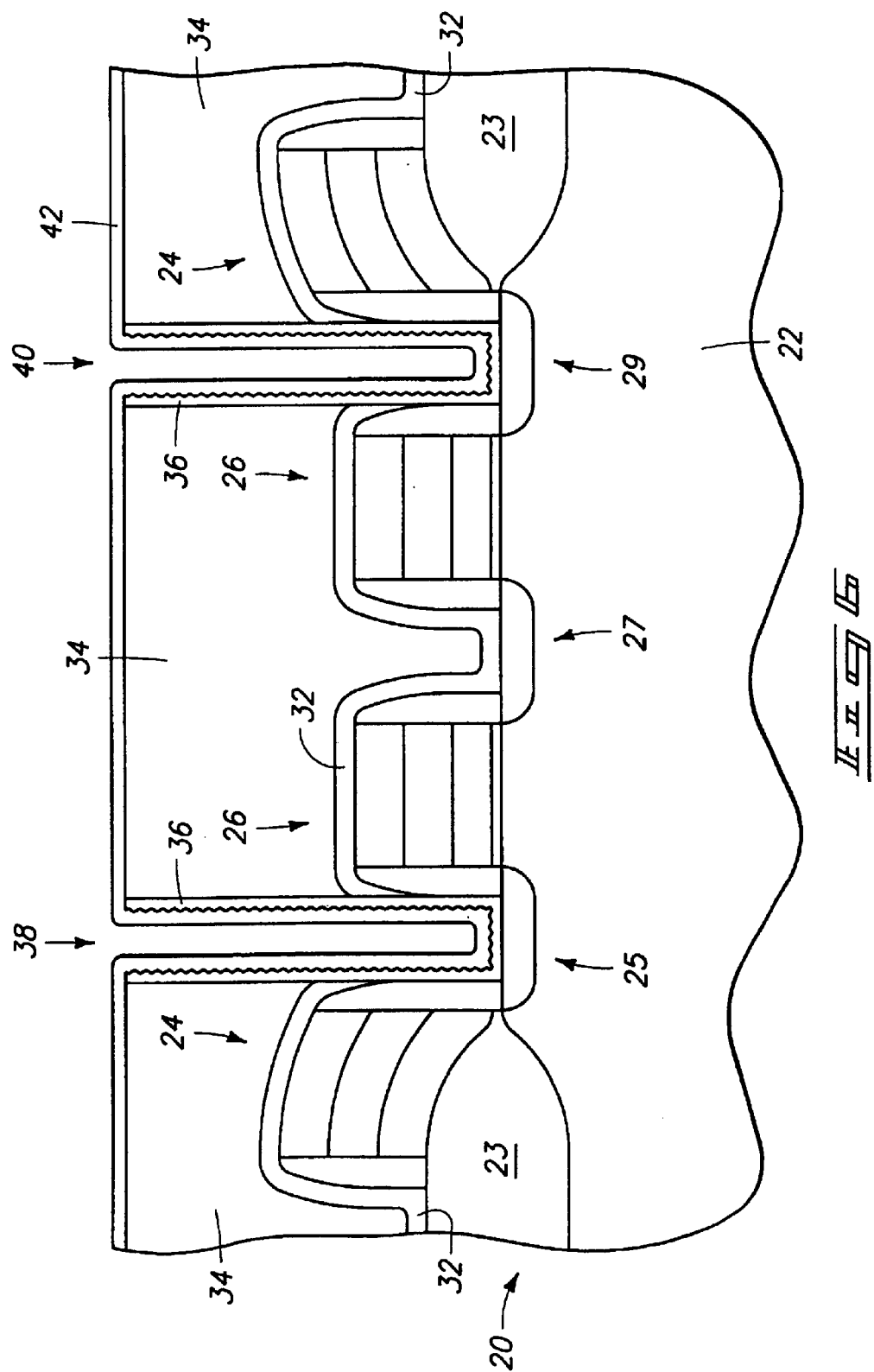
FIG. 6 shows the semiconductive wafer of FIG. 5 at a processing step subsequent to that shown in FIG. 5.

Formation of silicon nitride as a capacitor dielectric on storage node layer 36 is desired. Formation of silicon nitride on BPSG layer 34 as a dopant diffusion barrier is also desired. Formation of silicon nitride as a capacitor dielectric by ALD offers the advantage of a thin capacitor layer that possesses low electrical tunneling probability and low defect densities compared to traditional CVD silicon nitride. Simultaneous formation of silicon nitride over storage node layer 36 and BPSG layer 34 would also afford processing advantages. As described above, observation indicates that ALD of silicon nitride forms preferentially on polysilicon compared to BPSG. Accordingly, the various aspects of the present invention allow formation of a nucleation layer (not shown due to its preferably small thickness) on storage node layer 36 and BPSG layer 34 followed by formation of a deposition layer 42 as shown in FIG. 6 on the nucleation layer. The nucleation layer may be formed simultaneously and non-selectively on storage node layer 36 and BPSG layer 34. The nucleation layer may comprise silicon nitride, but may instead comprise some other compound. Accordingly, the nucleation layer may comprise a material that is not a suitable capacitor dielectric and/or dopant diffusion barrier.

Examples of process conditions for forming nucleation layers depends on the type of formation process and desired properties of the layer in keeping with the aspect of the invention described above. A silicon nitride nucleation layer may be formed in situ in a low pressure CVD hot wall batch reactor at about 645° C. and about 1.5 Torr. Processing time may be varied to form a layer of a thickness suitable for nucleation. Subsequently, a deposition layer may be formed on the nucleation layer within the low pressure CVD hot wall batch reactor. The deposition layer may be formed by ALD.

Alternatively, a silicon nitride nucleation layer may be formed ex situ using RTN at about 800° C. for about 60 seconds in an ammonia ambient. The substrate and nucleation layer may then be removed to a deposition device suitable for the deposition layer formation, such as by, ALD.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A low selectivity deposition method comprising:
   forming a first part of a nucleation layer directly on a first surface of a substrate;
   forming a second part of a nucleation layer directly on a second surface of the substrate; and
   forming a deposition layer comprising a chemisorbed first specie layer about one monolayer thick directly on the first and second parts of the nucleation layer substantially non-selectively on the first part of the nucleation layer compared to the second part, even though the first and second surfaces of the substrate exhibit a property of the deposition layer forming less readily on the first surface compared to the second surface.

2. The deposition method of claim 1 wherein the forming the first and the second part of the nucleation layer occurs by chemical vapor deposition.

3. The deposition method of claim 2 wherein CVD of the nucleation layer occurs non-selectively at a temperature no greater than about 645° C. and at a pressure of from about 500 milliTorr to about 1.5 Torr.

4. The deposition method of claim 1 wherein the forming the first and the second part of the nucleation layer occurs by atomic layer deposition.

5. The deposition method of claim 4 wherein the atomic layer deposition comprises contacting the substrate with only one precursor specie at a time.

6. The deposition method of claim 4 wherein ALD of the nucleation layer occurs non-selectively at a temperature of from about 400 to about 500° C. and at a pressure of from about 100 milliTorr to about 20 Torr.

7. The deposition method of claim 1 wherein the forming the first and the second part of the nucleation layer occurs simultaneously.

8. The deposition method of claim 1 wherein the forming the first and the second part of the nucleation layer occurs simultaneously and the nucleation layer forms substantially non-selectively on the first surface of the substrate compared to the second surface.

9. The deposition method of claim 1 wherein the forming the deposition layer is performed in situ of the forming the first and the second part of the nucleation layer.

10. The deposition method of claim 1 wherein the second part of the nucleation layer comprises a plurality of components also comprised by the first part.

11. The deposition method of claim 1 wherein the first and the second parts of the nucleation layer comprise silicon nitride, aluminum oxide, or tantalum oxide.

12. The deposition method of claim 1 wherein the first and the second parts of the nucleation layer consist essentially of same components in approximately same proportions.

13. The deposition method of claim 1 wherein a composition of the first part of the nucleation layer differs from a composition of the second part of the nucleation layer.

14. The deposition method of claim 1 wherein the first and the second parts of the nucleation layer comprise silicon nitride and the first part further comprises oxygen.

15. The deposition method of claim 1 wherein a thickness of the nucleation layer comprises less than about 20 Angstroms.

16. The deposition method of claim 15 wherein the thickness comprises less than about 6 Angstroms.

17. The deposition method of claim 1 wherein a thickness of the first part of the nucleation layer is greater than 50% of a thickness of the second part.

18. The deposition method of claim 17 wherein the thickness of the first part is greater than 80% of the thickness of the second part.

19. The deposition method of claim 1 wherein the chemisorbed first specie layer is one monolayer thick.

20. The deposition method of claim 1 wherein the first surface of the substrate exhibits a property of chemisorbing the first specie at a slower rate compared to the second surface.

21. The deposition method of claim 1 wherein the forming the deposition layer further comprises forming a layer at least one monolayer thick of a chemisorbed second specie different from the first specie on the first specie layer.

22. The deposition method of claim 21 wherein the second layer consists essentially of a monolayer.

23. The deposition method of claim 21 wherein the first and second specie layers, in combination, comprise silicon and nitrogen.

24. The deposition method of claim 21 wherein the nucleation layer comprises a material also comprised by the first and second specie layers combined.

25. The deposition method of claim 21 wherein forming the first and second parts of the nucleation layer occurs simultaneously and comprises depositing a complete nucleation layer in a single deposition, the complete nucleation layer and the combined first and second specie layers consisting essentially of same components in approximately same proportions.

26. The deposition method of claim 1 wherein the first and second parts of the nucleation layer comprise aluminum oxide.

27. The deposition method of claim 1 wherein the first and second parts of the nucleation layer comprise tantalum oxide.

28. The deposition method of claim 1 wherein the forming the deposition layer is performed ex situ of the forming the first and the second part of the nucleation layer.

29. A low selectivity deposition method comprising:
    simultaneously forming a first part of a nucleation layer on an insulative oxide material and a second part of the nucleation layer on a semiconductive material; and
    contacting the nucleation layer with an initiation precursor and forming an initiation layer about one monolayer thick on the first and second parts of the nucleation layer substantially non-selectively on the first part of the nucleation layer compared to the second part.

30. The deposition method of claim 29 wherein the initiation layer is one monolayer thick.

31. The deposition method of claim 29 wherein the first and the second parts of the nucleation layer consist essentially of same components in approximately same proportions.

32. The deposition method of claim 29 wherein the first and the second parts of the nucleation layer comprise silicon nitride and the first part further comprises oxygen.

33. The deposition method of claim 29 wherein a thickness of the nucleation layer comprises less than about 20 Angstroms.

34. The deposition method of claim 29 wherein a thickness of the first part of the nucleation layer is greater than about 50% of a thickness of the second part.

35. The deposition method of claim 29 wherein the insulative oxide exhibits a property of chemisorbing the initiation precursor at a slower rate compared to the semiconductive material.

36. The deposition method of claim 29 further comprising contacting the initiation layer with at least one deposition precursor and forming a deposition layer at least one monolayer thick on the initiation layer.

37. The deposition method of claim 36 wherein the deposition layer consists essentially of a monolayer.

38. The deposition method of claim 36 wherein the deposition precursor consists essentially of a single precursor specie.

39. The deposition method of claim 36 wherein the initiation and deposition layers, in combination, comprise silicon and nitrogen, or tantalum and oxygen, or aluminum and oxygen.

40. The deposition method of claim 36 wherein simultaneously forming the first and second parts of the nucleation layer comprises depositing a complete nucleation layer in a single deposition, the complete nucleation layer and the combined initiation and deposition layers consisting essentially of same components in approximately same proportions.

41. The deposition method of claim 29 wherein simultaneously forming the first and second parts of the nucleation layer comprises non-selective CVD at a temperature no greater than about 645° C. and at a pressure of from about 500 milliTorr to about 1.5 Torr.

42. The deposition method of claim 29 wherein simultaneously forming the first and second parts of the nucleation layer comprises non-selective ALD at a temperature of from about 400 to about 500° C. and at a pressure of from about 100 milliTorr to about 20 Torr.

43. A low selectivity deposition method comprising:
atomic layer depositing a nucleation substance chemisorbed directly on a first surface and a second surface of a substrate substantially non-selectively, wherein the first surface exhibits a property of chemisorbing an atomic layer deposition precursor at a slower rate compared to the second surface and the nucleation substance exhibits a property of chemisorbing the precursor at an approximately equal rate over the first surface compared to over the second surface.

44. The deposition method of claim 43 wherein the nucleation substance comprises an approximately homogeneous composition over the first and the second surface.

45. The deposition method of claim 43 wherein the nucleation layer comprises silicon nitride and a nucleation layer part that is over the first surface further comprises oxygen.

46. The deposition method of claim 43 wherein a thickness of the nucleation layer comprises less than about 20 Angstroms.

47. The deposition method of claim 43 wherein a thickness of a nucleation layer part that is over the first surface is greater than 50% of a thickness a nucleation layer part that is over the second surface.

48. The deposition method of claim 43 wherein ALD of the nucleation substance occures at a temperature of from about 400 to 550° C. and at a pressure of from about 100 milliTorr to about 20 Torr.

49. A low selectivity deposition method comprising:
placing a substrate in a deposition chamber;
forming a first part of a nucleation layer directly on a first surface of the substrate in the chamber;
forming a second part of a nucleation layer directly on a second surface of the substrate in the chamber; and
without removing the substrate from the chamber, forming a layer about one monolayer thick of a first chemisorbed precursor directly on the first and second parts of the nucleation layer substantially non-selectively on the first part of the nucleation layer compared to the second part.

50. The deposition method of claim 49 wherein the forming the first and the second part of the nucleation layer occurs simultaneously and the nucleation layer forms substantially non-selectively on the first surface of the substrate compared to the second surface.

51. The deposition method of claim 49 wherein the first surface of the substrate exhibits a property of chemisorbing the first precursor at a slower rate compared to the second surface.

52. The deposition method of claim 49 wherein the first surface comprises borophosphosilicate glass and the second surface comprises polysilicon.

53. A low selectivity deposition method comprising:
placing a substrate in a first chamber;
forming a first part of a nucleation layer directly on a first surface of the substrate in the first chamber;
forming a second part of a nucleation layer directly on a second surface of the substrate in the first chamber;
removing the substrate from the first chamber and placing it in a second chamber different from the first; and
forming a layer of a first chemisorbed specie at least one monolayer thick directly on the first and second parts of the nucleation layer in the second chamber substantially non-selectively on the first part of the nucleation layer compared to the second part.

54. The deposition method of claim 53 wherein the forming the first and the second part of the nucleation layer occurs simultaneously and the nucleation layer forms substantially non-selectively on the first surface of the substrate compared to the second surface.

55. The deposition method of claim 53 wherein the first surface of the substrate exhibits a property of chemisorbing the first specie at a slower rate compared to the second surface.

56. The deposition method of claim 53 wherein the first surface comprises borophosphosilicate glass and the second surface comprises polysilicon.

* * * * *

UNITED STATES PATENT AND TRADEMARK OFFICE
CERTIFICATE OF CORRECTION

PATENT NO.         : 7,192,888 B1
APPLICATION NO.    : 09/643004
DATED              : March 20, 2007
INVENTOR(S)        : Mercaldi It is certified that error appears in the above-identified patent and that said Letters Patent is hereby corrected as shown below:

On the face page, in field (56), under "Other Publications", in column 2, line 12, delete "13121-13121" and insert -- 13121-13131 --, therefor.

In column 11, line 35, in Claim 6, delete "500°" and insert -- 550° --, therefor.

In column 12, line 8, in Claim 19, after "layer is" insert -- saturated and uniformly --.

In column 12, line 17, in Claim 22, after "second" insert -- specie --.

In column 12, line 41, in Claim 29, after "layer" insert -- directly --.

In column 12, line 43, in Claim 29, after "layer" insert -- directly --

In column 12, line 46, in Claim 29, after "thick" insert -- directly --.

In column 12, line 50, in Claim 30, after "layer is" insert -- saturated and uniformly --.

In column 13, line 29, in Claim 42, delete "500°" and insert -- 550° --, therefor.

In column 13, line 56, in Claim 48, delete "occures" and insert -- occurs --, therefor.

In column 14, line 1, in Claim 48, after "400 to" insert -- about --.

Signed and Sealed this

Twentieth Day of November, 2007

JON W. DUDAS
*Director of the United States Patent and Trademark Office*